(12) United States Patent
Sakamoto

(10) Patent No.: US 7,632,626 B2
(45) Date of Patent: Dec. 15, 2009

(54) ANTI-REFLECTIVE COATING FORMING COMPOSITION FOR LITHOGRAPHY CONTAINING POLYMER HAVING ETHYLENEDICARBONYL STRUCTURE

(75) Inventor: Rikimaru Sakamoto, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 263 days.

(21) Appl. No.: 11/918,493

(22) PCT Filed: Apr. 13, 2006

(86) PCT No.: PCT/JP2006/307848

§ 371 (c)(1),
(2), (4) Date: Oct. 15, 2007

(87) PCT Pub. No.: WO2006/115074

PCT Pub. Date: Nov. 2, 2006

(65) Prior Publication Data

US 2008/0268379 A1 Oct. 30, 2008

(30) Foreign Application Priority Data

Apr. 19, 2005 (JP) ............... 2005-120697

(51) Int. Cl.
G03F 7/11 (2006.01)
G03F 7/38 (2006.01)
C08G 59/42 (2006.01)
H01L 21/027 (2006.01)

(52) U.S. Cl. ................. 430/311; 430/271.1; 430/272.1; 430/325; 430/326; 430/327; 430/330; 528/96; 528/97; 528/99; 528/115; 525/414; 525/419; 438/952

(58) Field of Classification Search .................. None
See application file for complete search history.

(56) References Cited

U.S. PATENT DOCUMENTS 3,963,686 A * 6/1976 Katsimbas .................. 525/114
4,574,146 A * 3/1986 Kordomenos et al. ........ 525/530
5,693,691 A 12/1997 Flaim et al.
5,919,599 A 7/1999 Meador et al.
2006/0290429 A1* 12/2006 Kishioka et al. ............. 330/292
2008/0038678 A1* 2/2008 Kishioka et al. ............. 430/327

FOREIGN PATENT DOCUMENTS

| EP | 1 298 492 A2 | 4/2003 |
|---|---|---|
| EP | 1 298 493 A2 | 4/2003 |
| JP | A 2003-345027 | 12/2003 |
| JP | A 2004-212907 | 7/2004 |
| WO | WO 2004/034148 A1 | 4/2004 |
| WO | WO 2005/098542 A1 | 10/2005 |

OTHER PUBLICATIONS

Kim et al., "Adaptability and Validity of Thin Organic Bottom Anti-Reflective Coating (BARD) to Sub-90nm Patterning in ArF Lithography", *Proceedings of SPIE*, vol. 5039, pp. 940-947 (2003).

Schmaljohann et al. "Design Strategies for 157 nm Single-Layer Photoresists: Lithographic Evaluation of a Poly (α-trifuloromethyl vinyl alcohol) Copolymer", *Proceedings of SPIE*, vol. 3999, pp. 330-334 (2000).

Crawford et al., "New Materials for 157 nm Photoresists: Characterization and Properties", *Proceedings of SPIE*, vol. 3999, pp. 357-364 (2000).

Patterson et al., "Polymers for 157 nm Photoresists Applications: A Progress Report", *Proceedings of SPIE*, Vol. 3999.

* cited by examiner

Primary Examiner—Cynthia Hamilton
(74) Attorney, Agent, or Firm—Oliff & Berridge, PLC

(57) ABSTRACT

There is provided an anti-reflective coating forming composition for lithography comprising a polymer having an ethylenedicarbonyl structure and a solvent; an anti-reflective coating formed from the composition; and a method for forming photoresist pattern by use of the composition. The anti-reflective coating obtained from the composition can be used in lithography process for manufacturing a semiconductor device, has a high preventive effect for reflected light, causes no intermixing with photoresists, and has a higher etching rate than photoresists.

12 Claims, No Drawings

ANTI-REFLECTIVE COATING FORMING COMPOSITION FOR LITHOGRAPHY CONTAINING POLYMER HAVING ETHYLENEDICARBONYL STRUCTURE

TECHNICAL FIELD

The present invention relates to a composition for forming an anti-reflective coating. Specifically, the present invention relates to an anti-reflective coating that is used as an underlayer of a photoresist layer in lithography process for manufacturing a semiconductor device, to a composition for forming the anti-reflective coating, and to a method for forming photoresist pattern by use of the composition.

BACKGROUND ART

Conventionally, in the manufacture of semiconductor devices, micro-processing by lithography using a photoresist composition has been carried out. The micro-processing is a processing method comprising forming a thin film of a photoresist composition on a silicon wafer, irradiating actinic rays such as ultraviolet rays through a mask pattern on which a pattern for a semiconductor device is depicted, developing it to obtain a resist pattern, and etching the substrate using the resist pattern as a protective film. However, in recent progress in high integration of semiconductor devices, there has been a tendency that shorter wavelength actinic rays are being used, i.e., ArF excimer laser beam (wavelength 193 nm) has been taking the place of i-line (wavelength 365 nm) or KrF excimer laser beam (wavelength 248 nm). Along with this change, influences of random reflection and standing wave of actinic rays from a substrate have become serious problems. Accordingly, it has been widely studied to provide an anti-reflective coating between the photoresist and the substrate (bottom anti-reflective coating).

As the anti-reflective coatings, inorganic anti-reflective coatings made of titanium, titanium dioxide, titanium nitride, chromium oxide, carbon or α-silicon, etc. and organic anti-reflective coatings made of a light absorbing substance and a high molecular weight compound are known. The former requires an installation such as a vacuum deposition apparatus, a CVD apparatus or a sputtering apparatus, etc. In contrast, the latter is considered advantageous in that it requires no special installation so that many studies have been made. For example, mention may be made of the acrylic resin type anti-reflective coating having a hydroxyl group being a crosslink-forming substituent and a light absorbing group in the same molecule as disclosed in U.S. Pat. No. 5,919,599 and the novolak resin type anti-reflective coating having a hydroxyl group being a crosslink-forming substituent and a light absorbing group in the same molecule as disclosed in U.S. Pat. No. 5,693,691.

The physical properties desired for organic anti-reflective coating include high absorbance to light and radioactive rays, no intermixing with the photoresist layer (being insoluble in photoresist solvents), no diffusion of low molecular substances from the anti-reflective coating material into the top-coat photoresist upon application or baking under heating, and a higher dry etching rate than the photoresist.

In recent years, miniaturization of process size in a lithography process by use of KrF excimer laser beam or ArF excimer laser beam, that is, miniaturization of formed photoresist pattern size is advanced. In order to prevent collapse or the like of photoresist pattern that is accompanied with miniaturization of photoresist pattern, it is desired to make the photoresist thinner. In addition, when the photoresist is used in a form of thin film, in order to inhibit decrease in film thickness of photoresist layer in the process of removing organic anti-reflective coating used together by etching, it is desired that the organic anti-reflective coating can be removed by etching for a shorter time. That is, in order to make the time required for an etching removing step shorter, there are demands for organic anti-reflective coatings that can be used in a form of thinner film compared with the conventional ones, or organic anti-reflective coatings having a higher selection ratio of etching rate between the organic anti-reflective coating and photoresist.

In addition, in a lithography process by use of ArF excimer laser beam (wavelength 193 nm), recently pattern collapse has become a problem with miniaturization of photoresist pattern. It is thought towards this problem that pattern collapse is prevented by making photoresists thinner and thus lowering the aspect ratio. However, there is fear that making photoresists that acts as a mask in etching process of semiconductor substrate thinner would cause any problems in substrate processing by etching.

Therefore, it is considered for solving these problems to apply a process in which a layer of inorganic material that is called a hard mask is used as an etching stopper. As the hard mask, materials having absorption in a light of wavelength 193 nm, such as silicon oxide nitride (SiON) or silicon nitride (SiN) are used in many cases. Thus, it is considered that an anti-reflective coating used together with such a hard mask is required to have a small attenuation coefficient (k) compared with the existing anti-reflective coatings that are not used together with a hard mask. For example, in case where an anti-reflective coating having a film thickness of 20 to 50 nm formed on a hard mask of silicon oxide nitride (SiON) or silicon nitride (SiN) is used, it is presumed that an attenuation coefficient (k) of the anti-reflective coating at light of a wavelength 193 nm is suitably about 0.1 to 0.3 (for example, see Non-patent Document 1).

From the above-mentioned circumstances, it has been desired to develop novel anti-reflective coatings.

On the other hand, it is disclosed to use polyesters synthesized from 1,3,5-tris(2-hydroxyethyl) cyanuric acid as an anti-reflective coating (for example, see Patent Documents 1 and 2).

Patent Document 1: EP-A-1298492 (2003) specification
Patent Document 2: EP-A-1298493 (2003) specification
Non-patent Document 1: Proceeding of SPIE, US, Vol. 5039, 2003, pp. 940-947

DISCLOSURE OF INVENTION

Problem to be Solved by the Invention

An object of the present invention is to provide an anti-reflective coating having a strong absorption to a light having a short wavelength, particularly ArF excimer laser beam (wavelength 193 nm). Another object of the present invention is to provide an anti-reflective coating that causes no intermixing with a photoresist layer and is easily removed by dry etching compared with the photoresist layer. Further, an object of the present invention is also to provide an anti-reflective coating that is suitable for using together with a hard mask.

In addition, an object of the present invention is to provide an anti-reflective coating forming composition for lithography for forming the anti-reflective coating. Further, an object of the present invention is to provide a method for forming photoresist pattern by use of the anti-reflective coating forming composition.

Means for Solving the Problem

Taking the above-mentioned present status into account, the present inventors eagerly investigated, and as a result of it, they found that an anti-reflective coating excellent for lithography process by use of a light having a short wavelength can be formed from a composition containing a polymer having an ethylenedicarbonyl structure, and they completed the present invention.

That is, the present invention relates to the following aspects:

- as a first aspect, an anti-reflective coating forming composition for lithography comprising:
  a polymer having a repeating structural unit of formula (1) or (2):

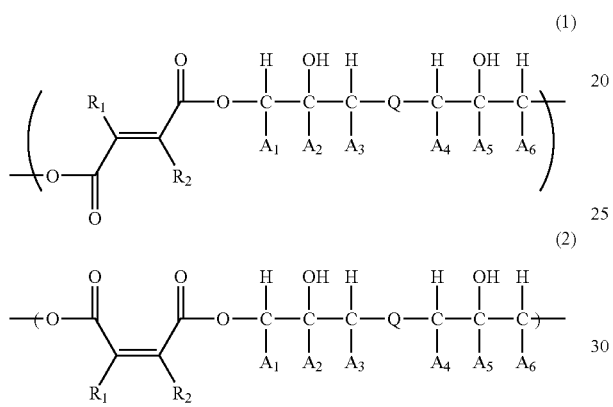

wherein $R_1$ and $R_2$ independently of each other are hydrogen atom, methyl, ethyl or halogen atom, $A_1$, $A_2$, $A_3$, $A_4$, $A_5$, $A_6$ and $A_6$ independently of one another are hydrogen atom, methyl or ethyl, Q is a group of formula (3) or (4):

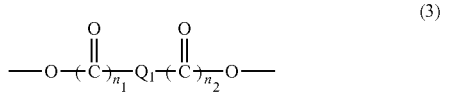

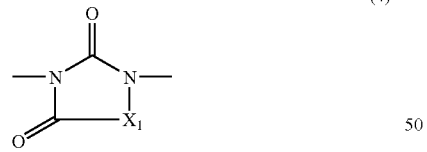

wherein $Q_1$ is $C_{1-15}$alkylene, phenylene, naphthylene or anthrylene, and the phenylene, naphthylene and anthrylene may be substituted by a substituent selected from the group consisting of $C_{1-6}$alkyl, halogen atom, $C_{1-6}$alkoxy, nitro, cyano, hydroxy and $C_{1-6}$alkylthio, $n_1$ and $n_2$ independently of each other are a number of 0 or 1, $X_1$ is a group of formula (5), (6) or (7)

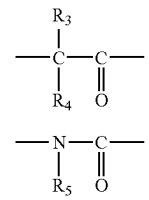

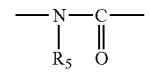

wherein $R_3$ and $R_4$ independently of each other are hydrogen atom, $C_{1-6}$alkyl, $C_{3-6}$alkenyl, benzyl or phenyl, and the phenyl may be substituted by a substituent selected from the group consisting of $C_{1-6}$alkyl, halogen atom, $C_{1-6}$alkoxy, nitro, cyano, hydroxy and $C_{1-6}$alkylthio, or $R_3$ and $R_4$ together may form $C_{3-6}$ring, $R_5$ is $C_{1-6}$alkyl, $C_{3-6}$alkenyl, benzyl or phenyl, and the phenyl may be substituted by a substituent selected from the group consisting of $C_{1-6}$alkyl, halogen atom, $C_{1-6}$alkoxy, nitro, cyano, hydroxy and $C_{1-6}$alkylthio, and a solvent;

- as a second aspect, the anti-reflective coating forming composition for lithography as described in the first aspect, wherein the polymer is a polymer produced by polyaddition reaction of a compound of formula (8) or (9) with a compound of formula (10):

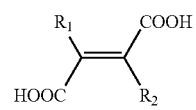

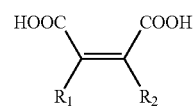

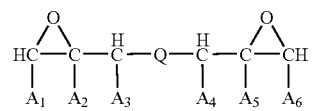

wherein $R_1$, $R_2$, $A_1$, $A_2$, $A_3$, $A_4$, $A_5$, $A_6$ and Q are as defined above;

- as a third aspect, the anti-reflective coating forming composition for lithography as described in the second aspect, wherein the compound of formula (10) is a compound of formula (11):

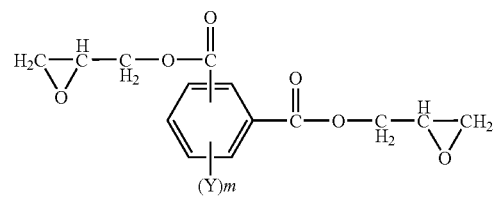

wherein Y is $C_{1-6}$alkyl, halogen atom, $C_{1-6}$alkoxy, nitro, cyano, hydroxy or $C_{1-6}$alkylthio, m is an integer of 0 to 4, and when m is 2 to 4, the above-mentioned Y may be identical with or different from each other;

as a fourth aspect, the anti-reflective coating forming composition for lithography as described in the first aspect, wherein the polymer is a polymer having a repeating structural unit of formula (12):

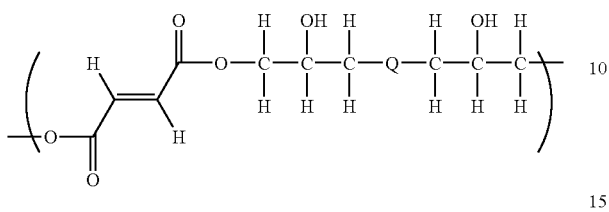

wherein Q is as defined above;

as a fifth aspect, the anti-reflective coating forming composition for lithography as described in the first aspect, wherein the polymer is a polymer having a repeating structural unit of formulae (13) and (14):

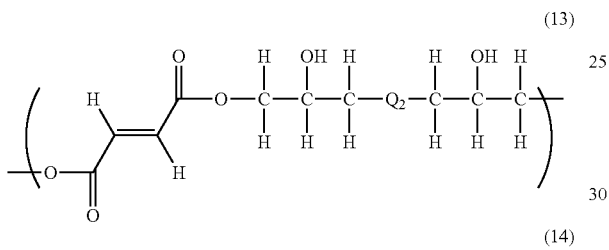

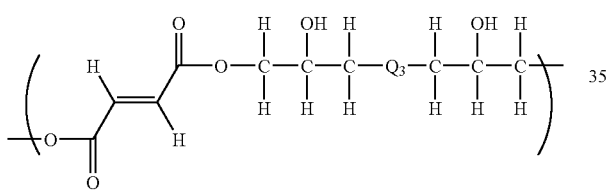

wherein $Q_2$ is a group of formula (15), (16) or (17):

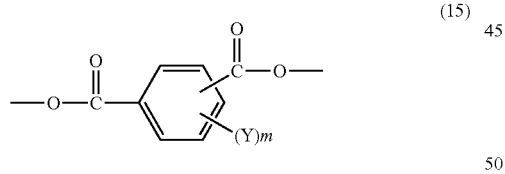

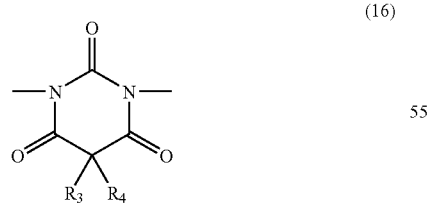

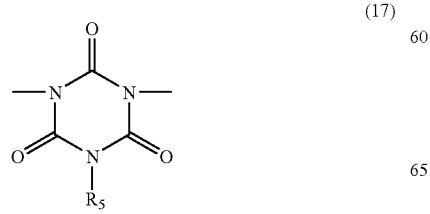

wherein Y, m, $R_3$, $R_4$ and $R_5$ are as defined above, $Q_3$ is a group of formula (18):

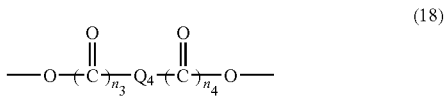

wherein $Q_4$ is $C_{1-15}$alkylene, $n_3$ and $n_4$ independently of each other are a number of 0 or 1;

as a sixth aspect, the anti-reflective coating forming composition for lithography as described in the first aspect, comprising further a crosslinking compound;

as a seventh aspect, the anti-reflective coating forming composition for lithography as described in the sixth aspect, comprising further an acid compound;

as an eighth aspect, the anti-reflective coating forming composition for lithography as described in the sixth aspect, wherein the crosslinking compound is a nitrogen-containing compound containing 2 to 4 nitrogen atoms substituted with methylol or alkoxymethyl;

as a ninth aspect, the anti-reflective coating forming composition for lithography as described in the seventh aspect, wherein the acid compound is a sulfonic acid compound;

as a tenth aspect, the anti-reflective coating forming composition for lithography as described in the seventh aspect, wherein the acid compound is a combination of a iodonium salt based acid generator or a sulfonium salt based acid generator with a sulfonic acid compound;

as an eleventh aspect, a method for forming photoresist pattern for use in manufacture of semiconductor device, comprising the steps of:

coating the anti-reflective coating forming composition for lithography as described in the first aspect on a semiconductor substrate, and baking it to form an anti-reflective coating, forming a photoresist layer on the anti-reflective coating, exposing the semiconductor substrate covered with the anti-reflective coating and the photoresist layer to light, and developing the photoresist layer after the exposure to light; and as a twelfth aspect, the method for forming photoresist pattern as described in the eleventh aspect, wherein the exposure to light is carried out with ArF excimer laser beam (wavelength 193 nm).

EFFECT OF THE INVENTION

The present invention relates to a composition for forming an anti-reflective coating having a strong absorption to a light having a short wavelength, particularly ArF excimer laser beam (wavelength 193 nm). The resulting anti-reflective coating effectively absorbs a light reflected from a substrate.

The present invention can provide an anti-reflective coating that effectively absorbs a light reflected from a semiconductor substrate in fine processing by use of a light having a short wavelength, particularly ArF excimer laser beam (wavelength 193 nm), that causes no intermixing with a photoresist layer, and that can be easily removed by dry etching compared with the photoresist layer. In addition, the present invention can provide an anti-reflective coating that is suitable for using together with a hard mask.

Further, the use of the anti-reflective coating of the present invention makes possible to form a photoresist pattern having a good form in lithography process by use of a light having a short wavelength.

BEST MODE FOR CARRYING OUT THE INVENTION

The anti-reflective coating forming composition for lithography according to the present invention comprises a polymer having a repeating structural unit of formula (1) or (2) and a solvent. In addition, the anti-reflective coating forming composition of the present invention comprises a polymer having a repeating structural unit of formula (1) or (2), a crosslinking compound and a solvent. Further, the anti-reflective coating forming composition for lithography of the present invention comprises a polymer having a repeating structural unit of formula (1) or (2), a crosslinking compound, an acid compound and a solvent. Also, the anti-reflective coating forming composition of the present invention can comprise other components such as surfactants and rheology controlling agents, etc.

In the anti-reflective coating forming composition of the present invention, the polymer having a repeating structural unit of formula (1) or (2) is an essential component. The proportion of the polymer having a repeating structural unit of formula (1) or (2) in the solid content in the anti-reflective coating forming composition of the present invention is 50 mass % or more from the viewpoint of anti-reflective effect, preferably 60 mass % or more, for example 50 to 100 mass %, or 60 to 99 mass %, or 70 to 95 mass %. The proportion of the solid content in the anti-reflective coating forming composition of the present invention is not specifically limited so long as each component homogeneously dissolves in the solvent, for example it is 1 to 50 mass %, or 5 to 30 mass %, or 10 to 25 mass %. In this specification, the solid content means all components of the anti-reflective coating forming composition for lithography from which the solvent component is excluded.

The anti-reflective coating forming composition for lithography according to the present invention contains the polymer having a repeating structural unit of formula (1) or (2).

In formula (1) or (2), $R_1$ and $R_2$ independently of each other are hydrogen atom, methyl, ethyl or halogen atom, $A_1, A_2, A_3, A_4, A_5, A_6$ and $A_6$ independently of one another are hydrogen atom, methyl or ethyl, Q is a group of formula (3) or (4). The halogen atom is fluorine atom, chlorine atom, bromine atom or iodine atom.

In formula (3), $Q_1$ is $C_{1-15}$alkylene, phenylene, naphthylene or anthrylene, and the phenylene, naphthylene and anthrylene may be substituted by a substituent selected from the group consisting of $C_{1-6}$alkyl, halogen atom, $C_{1-6}$alkoxy, nitro, cyano, hydroxy and $C_{1-6}$alkylthio.

Concrete examples of the alkyl include methyl, ethyl, isopropyl, n-butyl and cyclohexyl, etc. Concrete examples of the alkoxy include methoxy, ethoxy, n-pentyloxy, isopropoxy and cyclohexyloxy, etc. Concrete examples of the alkylthio include methylthio, ethylthio, n-pentylthio, isopropylthio and cyclohexylthio, etc. The halogen atom includes fluorine atom, chlorine atom, bromine atom, or iodine atom. Concrete examples of the alkylene include straight-chain alkylene such as methylene, ethylene, n-propylene, n-pentylene and n-octylene, etc., branched alkylene such as 2-methylpropylene and 1,4-dimethylbutylene, etc., and cyclic alkylene such as cyclopentylene, cyclobutylene, cyclohexylene and 2-methyl-cyclohexylene, etc. In addition, in case where $Q_1$ is phenylene, naphthylene or anthrylene, the bonding position thereof is not specifically limited. That is, for example there may be cases where phenylene is bonded at 1- and 2-positions, at 1- and 3-positions, or at 1- and 4-positions, where naphthylene is bonded at 1- and 2-positions, at 1- and 4-positions, at 1- and 5-positions, or at 2- and 3-positions, where anthrylene is bonded at 1- and 2-positions, at 1- and 4-positions, or at 9- and 10-positions, and the like, every cases are possible. In addition, $n_1$ and $n_2$ independently of each other are a number of 0 or 1.

In formula (4), $X_1$ is a group of formula (5), (6) or (7). And, in formula (4), in case where $X_1$ is a group of formula (6), the structure thereof is represented by formula (4-6), and in case where $X_1$ is a group of formula (7), the structure thereof is represented by formula (4-7).

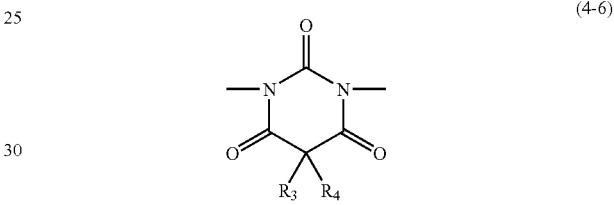

(4-6)

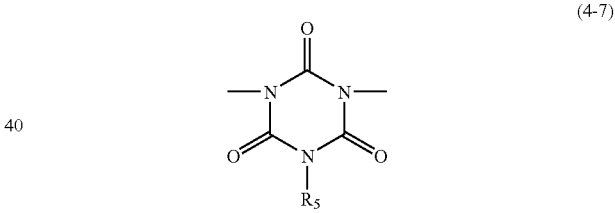

(4-7)

In formulae (5) and (6), $R_3$ and $R_4$ independently of each other are hydrogen atom, $C_{1-6}$alkyl, $C_{3-6}$alkenyl, benzyl or phenyl. Concrete examples of the alkyl are groups as mentioned above. Concrete example of the alkenyl include 2-propenyl and 3-butenyl, etc. In addition, the phenyl may be substituted by a substituent selected from the group consisting of $C_{1-6}$alkyl, halogen atom, $C_{1-6}$alkoxy, nitro, cyano, hydroxy and $C_{1-6}$alkylthio. Concrete examples of the alkyl, alkoxy and alkylthio are groups as mentioned above. Further, $R_3$ and $R_4$ together may form $C_{3-6}$ring including the carbon atom to which $R_3$ and $R_4$ are bonded. Such a ring includes cyclobutane ring, cyclopentane ring and cyclohexane ring.

In formula (7), $R_5$ is $C_{1-6}$alkyl, $C_{3-6}$alkenyl, benzyl or phenyl, and the phenyl may be substituted by a substituent selected from the group consisting of $C_{1-6}$alkyl, halogen atom, $C_{1-6}$alkoxy, nitro, cyano, hydroxy and $C_{1-6}$alkylthio. Concrete examples of the alkyl, alkenyl, alkoxy and alkylthio are groups as mentioned above.

Concrete examples of the repeating structural unit of formula (1) or (2) include for example the structure of formulae (19) to (34).

(19)
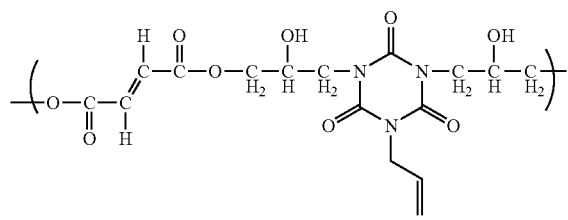
(20)
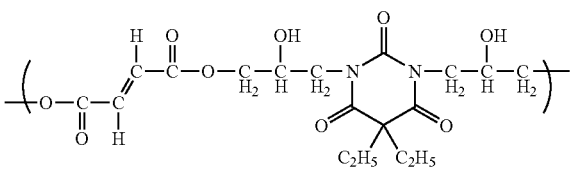
(21)
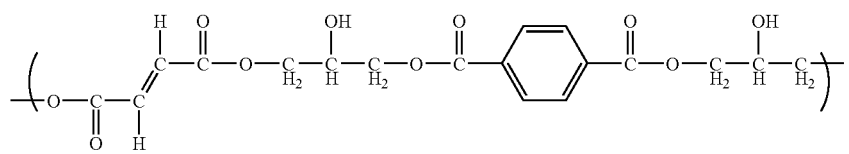
(22)
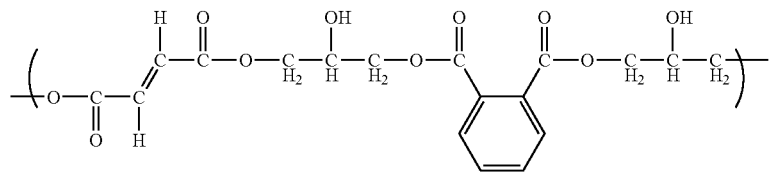
(23)
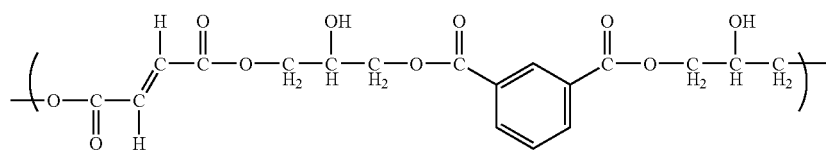
(24)
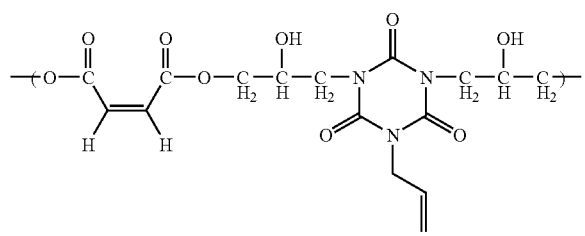
(25)
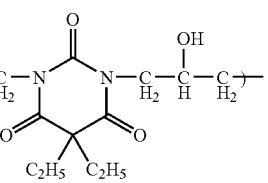
(26)
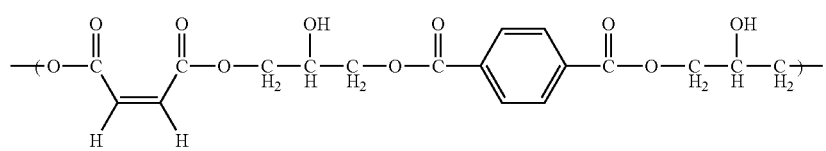
(27)
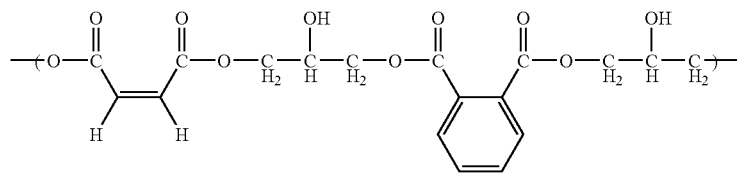
(28)
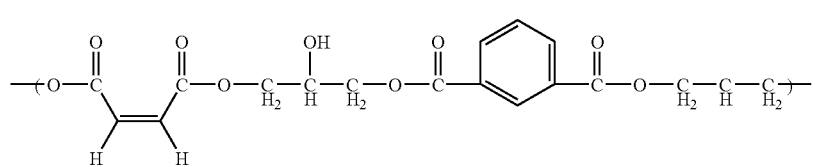

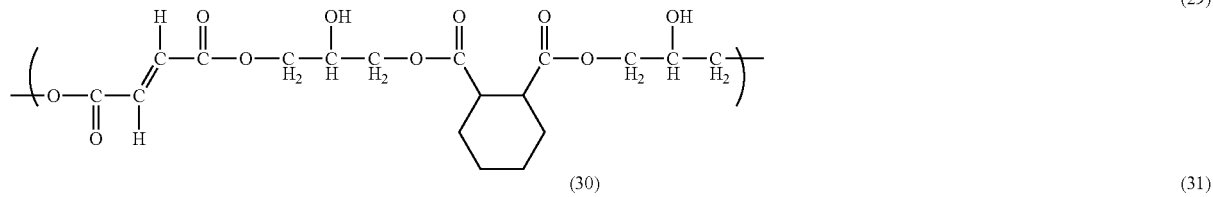

(29)

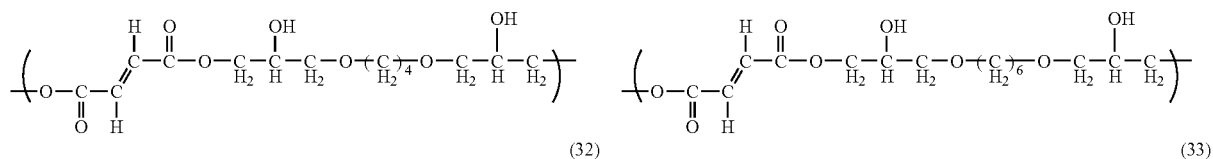

(30)                                      (31)

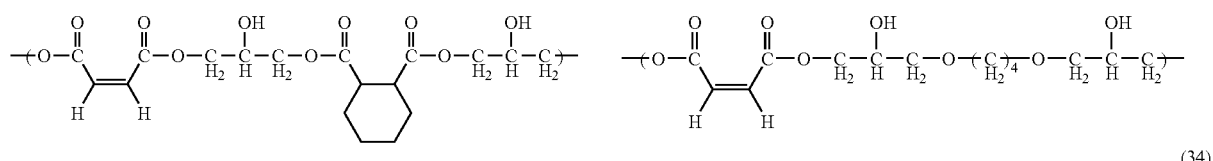

(32)                                      (33)

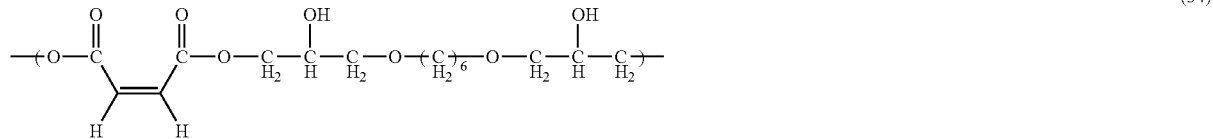

(34)

The polymer having the repeating structural unit of formula (1) or (2) contained in the anti-reflective coating forming composition for lithography according to the present invention can be produced by for example a polyaddition reaction of a compound of formula (8) or (9) with a compound of formula (10).

The polymer having the repeating structural unit of formula (1) can be produced by for example a polyaddition reaction of a compound (dicarboxylic acid compound) of formula (8) with a compound (diepoxy compound) of formula (10) (the following reaction equation (R-1)). The polymer having the repeating structural unit of formula (2) can be produced by for example a polyaddition reaction of a compound (dicarboxylic acid compound) of formula (9) with a compound (diepoxy compound) of formula (10) (the following reaction equation (R-2)).

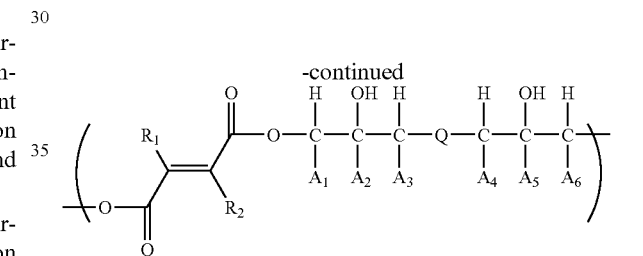

(1)

(8)

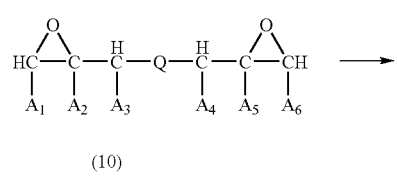

(10)

(R-1)

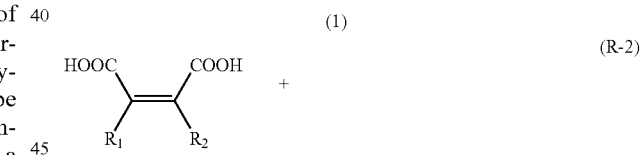

(9)

(R-2)

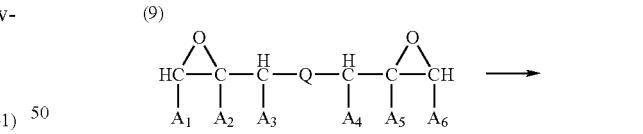

(10)

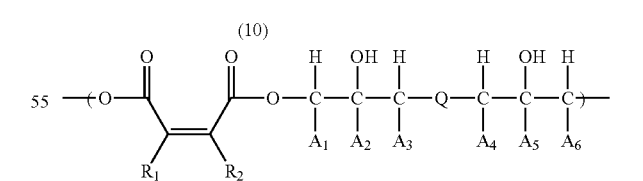

(2)

When only the compound of formula (8) and the compound of formula (10) are used for producing the polymer having the repeating structural unit of formula (1), it is assumed that the resulting polymer is a polymer having substantially only the structure of formula (1) as repeating structural unit except the end portion of the polymer. When only the compound of formula (9) and the compound of formula (10) are used for producing the polymer having the repeating structural unit of formula (2), it is assumed that the resulting polymer is a polymer having substantially only the structure of formula (2) as repeating structural unit except the end portion of the polymer.

It is preferable to carry out the reaction of a compound of formula (8) or (9) with a compound of formula (10) in a solution state dissolved in an organic solvent such as benzene, toluene, xylene, ethyl lactate, butyl lactate, propylene glycol monomethyl ether, propylene glycol monomethyl ether acetate and N-methylpyrrolidone, etc. In the reaction, a quaternary ammonium salt such as benzyltriethylammonium chloride, tetrabutylammonium chloride, and tetraethylammonium bromide, etc. can be used as a catalyst. The reaction temperature and reaction time of the reaction depends on the compounds used therefor, the concentration thereof, or the like, but a reaction time ranging from 0.1 to 100 hours or a reaction temperature ranging from 20 to 200° C. is suitably selected. When the catalyst is used, it can be used in an amount of 0.001 to 30 mass % based on the total mass of compounds used.

In addition, the proportion of the compound of formula (8) or (9) and the compound of formula (10) is a molar ratio of 3:1 to 1:3, preferably 3:2 to 2:3, or 5:4 to 4:5, or 1:1 shown in the compound of formula (8) or (9): the compound of formula (10). In the anti-reflective coating forming composition for lithography according to the present invention, a polymer obtained by a reaction of a mixture of the compounds of formulae (8) and (9) with the compound of formula (10) can be also used. In this case, the resulting polymer is a polymer having the repeating structural unit of formula (1) and the repeating structural unit of formula (2). In the reaction, when a mixture of the compounds of formulae (8) and (9) is used, the used proportion is a molar ratio of 3:1 to 1:3, preferably 3:2 to 2:3, or 5:4 to 4:5, or 1:1 shown in the mixture of the compounds of formulae (8) and (9): the compound of formula (10).

The reaction of the compound of formula (8) or (9) with the compound of formula (10) can be carried out as follows, for example. The compound of formula (8) or (9) and the compound of formula (10) are dissolved in a suitable organic solvent in a molar ratio of 5:4 to 4:5, or 1:1 so that total concentration of both compounds is 10 to 40 mass % or 15 to 35 mass %. Then, a quaternary ammonium salt such as benzyltriethylammonium chloride or the like is added in an amount of 0.1 to 5 mass % or 0.5 to 3 mass % based on the total mass of the compound of formula (8) or (9) and the compound of formula (10). Thereafter, the reaction can be carried out at a reaction temperature of 80 to 150° C. for a reaction time of 3 to 30 hours.

The compound of formula (8) includes for example fumaric acid, dihydroxyfumaric acid and chlorofumaric acid, etc.

The compound of formula (9) includes for example maleic acid, methylmaleic acid, bromomaleic acid, dibromomaleic acid, isopropylmaleic acid and phenylmaleic acid, etc.

The compound of formula (10) includes for example diglycidyl terephthalate compounds such as diglycidyl terephthalate, diglycidyl 2,5-dimethylterephthalate, diglycidyl 2,5-diethylterephthalate, diglycidyl 2,3,5,6-tetrachloroterephthalate, diglycidyl 2,3,5,6-tetrabromoterephthalate, diglycidyl 2-nitroterephthalate, diglycidyl 2,3,5,6-tetrafluoroterephthalate, diglycidyl 2,5-dihydroxyterephthalate, diglycidyl 2,6-dimethylterephthalate, and diglycidyl 2,5-dichloroterephthalate, etc., and also includes diglycidyl isophthalate compounds such as diglycidyl isophthalate, diglycidyl 2,3-dichloroisophthalate, diglycidyl 3-nitroisophthalate, diglycidyl 2-bromoisophthalate, diglycidyl 2-hydroxyisophthalate, diglycidyl 3-hydroxyisophthalate, diglycidyl 2-methoxyisophthalate, and diglycidyl 5-phenylisophthalate, etc., and further includes diglycidyl phthalate compounds such as diglycidyl phthalate, diglycidyl 3-nitrophthalate, diglycidyl 3,4,5,6-tetrachlorophthalate, diglycidyl 4,5-dichlorophthalate, diglycidyl 4-hydroxtphthalate, diglycidyl 4-nitrophthalate, diglycidyl 4-methylphthalate and diglycidyl 3,4,5,6-tetrafluorophthalate, etc.

In addition, the compound of formula (10) includes for example diglycidyl hydantoin compounds such as 1,3-diglycidyl hydantoin, 1,3-diglycidyl-5,5-diphenyl hydantoin, 1,3-diglycidyl-5,5-dimethyl hydantoin, 1,3-diglycidyl-5-methyl hydantoin, 1,3-diglycidyl-5-ethyl-5-phenyl hydantoin, 1,3-diglycidyl-5-benzyl hydantoin, 1,3-diglycidyl-5-hydantoin acetic acid, 1,3-diglycidyl-5-ethyl-5-methyl hydantoin, 1,3-diglycidyl-5-methyl hydantoin, 1,3-diglycidyl-5,5-tetramethylene hydantoin, 1,3-diglycidyl-5,5-pentamethylene hydantoin, 1,3-diglycidyl-5-(4-hydroxybenzyl) hydantoin, 1,3-diglycidyl-5-phenyl hydantoin, 1,3-diglycidyl-5-hydroxymethyl hydantoin, and 1,3-diglycidyl-5-(2-cyanoethyl) hydantoin, etc.

In addition, the compound of formula (10) includes for example diglycidyl barbituric acid compounds such as 1,3-diglycidyl-5,5-diethyl barbituric acid, 1,3-diglycidyl-5-phenyl-5-ethyl barbituric acid, 1,3-diglycidyl-5-ethyl-5-isoamyl barbituric acid, 1,3-diglycidyl-5-allyl-5-isobutyl barbituric acid, 1,3-diglycidyl-5-allyl-5-isopropyl barbituric acid, 1,3-diglycidyl-5-β-bromoallyl-5-sec-butyl barbituric acid, 1,3-diglycidyl-5-ethyl-5-(1-methyl-1-butenyl) barbituric acid, 1,3-diglycidyl-5-isopropyl-5-β-bromoallyl barbituric acid, 1,3-diglycidyl-5-(1-cyclohexyl)-5-ethylmalonyl urea, 1,3-diglycidyl-5-ethyl-5-(1-methylbutyl) malonyl urea, 1,3-diglycidyl-5,5-diallylmalonyl urea diglycidyl, and 1,3-diglycidyl-5-ethyl-5-n-butyl barbituric acid, etc.

Further, the compound of formula (10) includes for example diglycidyl isocyanuric acid compounds such as allyldiglycidyl isocyanuric acid, ethyldiglycidyl isocyanuric acid, propyldiglycidyl isocyanuric acid, isopropyldiglycidyl isocyanuric acid, phenyldiglycidyl isocyanuric acid, 2-chlorophenyldiglycidyl isocyanuric acid, benzyldiglycidyl isocyanuric acid, and methyldiglycidyl isocyanuric acid, etc.

The compound of formula (10) includes for example diglycidyl naphthalene dicarboxylate compounds such as diglycidyl 2,6-naphthalene dicarboxylate, diglycidyl 1,2-naphthalene dicarboxylate, and diglycidyl 1,4-naphthalene dicarboxylate, diglycidyl 1,8-naphthalene dicarboxylate, etc.

The compound of formula (10) includes for example diglycidyl anthracene dicarboxylate compounds such as diglycidyl anthracene-9,10-dicarboxylate, etc.

In addition, the compound of formula (10) includes for example diglycidyl aliphatic dicarboxylate compounds such as diglycidyl 1,2-cyclohexane dicarboxylate, diglycidyl 1,3-cyclohexane dicarboxylate, diglycidyl 1,4-cyclohexane dicarboxylate, diglycidyl 1,5-pentane dicarboxylate, diglycidyl 1,4-pentane dicarboxylate, diglycidyl 1,3-pentane dicarboxylate, diglycidyl 1,3-propane dicarboxylate, diglycidyl 1,4-butane dicarboxylate, diglycidyl 1,3-butane dicarboxylate, diglycidyl 1,6-hexane dicarboxylate, diglycidyl 1,5-hexane dicarboxylate, diglycidyl 1,4-hexane dicarboxylate, diglycidyl 1,3-hexane dicarboxylate, and diglycidyl 1,2-hexane dicarboxylate, etc.

The compound of formula (10) also includes for example diglycidyl ether compounds such as 1,5-naphthalenediol diglycidyl ether, 2,6-naphthalenediol diglycidyl ether, 1,2-naphthalenediol diglycidyl ether, 1,4-naphthalenediol diglycidyl ether, 1,8-naphthalenediol diglycidyl ether, anthracene-9,10-diol diglycidyl ether, diglycidyl resorcinol, diglycidyl catechol, 1,4-benzenediol diglycidyl ether, 1,4-butanediol diglycidyl ether, 1,6-hexanediol diglycidyl ether, 1,3-propanediol diglycidyl ether, 1,5-pentanediol diglycidyl ether, and ethylene glycol diglycidyl ether, etc.

As the compound of formula (10), the compound of formula (11) can be mentioned. In formula (11), Y is $C_{1-6}$alkyl, halogen atom, $C_{1-6}$alkoxy, nitro, cyano, hydroxy or $C_{1-6}$alkylthio, m is an integer of 0 to 4, and when m is 2 to 4, the above-mentioned Y may be identical with or different from each other. In the meantime, when m is 0 to 3, (4-m) of other positions are hydrogen atoms. Concrete examples of the alkyl, alkoxy and alkylthio include groups as mentioned above. Concrete examples of the compounds of formula (11) include the above-mentioned diglycidyl terephthalate compounds, diglycidyl isophthalate compounds, and diglycidyl phthalate compounds.

For example, in case where fumaric acid and diglycidyl terephthalate are used as the compound of formula (8) and the compound of formula (10), respectively, it is estimated that the resulting polymer is a polymer having the structure of formula (21) as a repeating structural unit. In addition, for example, in case where fumaric acid is used as the compound of formula (8) and two kinds of diglycidyl terephthalate and 1,4-butanediol diglycidyl ether are used as the compound of formula (10), it is estimated that the resulting polymer is a polymer having the structures of formulae (21) and (30) as repeating structural units.

The polymer contained in the anti-reflective coating forming composition for lithography according to the present invention includes a polymer having the repeating structural unit of formula (12). Such a polymer can be produced by a polyaddition reaction of fumaric acid with the compound of formula (10).

The polymer contained in the anti-reflective coating forming composition for lithography according to the present invention also includes a polymer having the repeating structural units of formulae (13) and (14).

In the formula, $Q_2$ is a structure of formula (15), (16) or (17), $Q_3$ is a structure of formula (18). In the meanwhile, Y, m, $R_3$, $R_4$ and $R_6$ are as defined above. In formula (18), $Q_4$ is $C_{1-15}$alkylene, phenylene, $n_3$ and $n_4$ independently of each other are a number of 0 or 1. The alkylene includes for example straight-chain alkylene such as methylene, ethylene, n-propylene and n-pentylene, etc., branched alkylene such as 2-methyl propylene and 1,4-dimethyl butylene, etc., cyclic alkylene such as cyclopentylene, cyclobutylene and cyclohexylene, etc.

The above-mentioned polymer having the repeating structural units of formulae (13) and (14) can be produced by reacting fumaric acid with a compound selected from the group consisting of the compounds of formula (11), diglycidyl barbituric acid compounds and diglycidyl isocyanuric acid compounds, and the compound of formula (35).

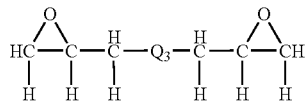
(35)

For example, when fumaric acid, 1,3-diglycidyl-5,5-diethylbarbituric acid and diglycidyl 1,2-cyclohexane dicarboxylate are used for the production of the polymer, it is estimated that the resulting polymer is a polymer having the structure of formula (20) (in formula (13), $Q_2$ is a group of formula (16) in which both $R_3$ and $R_4$ are ethyl) and the structure of formula (29) (in formula (14), $Q_3$ is a group of formula (18) in which both $n_3$ and $n_4$ are 1, and $Q_4$ is 1,2-cyclohexylene) as repeating structural units.

The polymer having the repeating structural unit of formula (1) or (2) contained in the anti-reflective coating forming composition for lithography according to the present invention can be produced by a reaction of a compound of formula (8) or (9) with a compound of formula (10), as mentioned above. In these reactions, in addition to the compounds of formulae (8) to (10), other compounds such as compounds having 1 to 4 groups that can be reacted with an epoxy, for example hydroxy, thiol, carboxy and amino, etc., and compounds having 1 to 4 epoxy groups and the like, can be used together, if necessary. When these other compounds are used, the used amount thereof is for example 1 to 100 mass parts, or 5 to 50 mass parts, or 10 to 25 mass parts based on 100 mass parts of the total amount of the compounds of formulae (8) to (10) that used in the reaction.

The compounds having 1 to 4 groups that can be reacted with an epoxy, for example hydroxy, thiol, carboxy and amino, etc. include for example ethane dithiol, 1,3-propane dithiol, 1,4-benzene dithiol, 2-dimethylamino-1,3,5-triazine-4,6-dithiol, tris-2-carboxyethylisocyanuric acid, tris-3-carboxypropylisocyanuric acid, ethylene diamine, phenylene diamine, glycerol, triethanolamine, aminophenol and 4,4'-dihydroxydiphenylsulfone, and the like.

The compounds having 1 to 4 epoxy groups include for example tris(2,3-epoxypropyl) isocyanuric acid, tetraglycidyl diaminodiphenylmethane, bisphenol-A-diglycidyl ether, and bisphenol-S-diglycidyl ether, and the like.

In the anti-reflective coating forming composition of the present invention, the polymer having the repeating structural unit of formula (1) or (2) may be used singly or in a combination of two or more polymers. The polymer having the repeating structural unit of formula (1) or (2) contained in the anti-reflective coating forming composition of the present invention has a molecular weight of for example 1000 to 200000, or 3000 to 100000, or 4000 to 30000, or 5000 to 20000 in terms of weight average molecular weight.

The anti-reflective coating forming composition for lithography according to the present invention can contain a crosslinking compound. The crosslinking compound is not specifically limited, but crosslinking compounds having at least two crosslink-forming substituents are preferably used. For example, compounds having two or more, for example 2 to 6 crosslinkable groups such as isocyanate groups, epoxy groups, hydroxymethylamino groups, and alkoxymethylamino groups, etc. can be used.

The crosslinking compounds include nitrogen-containing compounds having one to six or two to four nitrogen atoms substituted with methylol or alkoxymethyl such as methoxymethyl, ethoxymethyl, butoxymethyl, and hexyloxymethyl or the like. Concretely they include nitrogen-containing compounds such as hexamethoxymethyl melamine, tetramethoxymethyl benzoguanamine, 1,3,4,6-tetrakis(methtoxymethyl)glycoluril, 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, 1,1,3,3-tetrakis(methoxymethyl)urea, 1,3-bis(hydroxymethyl)-4,5-dihydroxy-2-imidazolinone, and 1,3-bis(methoxymethyl)-4,5-dimethoxy-2-imidazolinone, etc. In addition, the crosslinking compounds may be commercially available nitrogen-containing compounds such as methoxymethyl type melamine compounds manufactured by Mitsui Cytec Co., Ltd. (trade name: Cymel 300, Cymel 301, Cymel 303, Cymel 350), butoxymethyl type melamine compounds (trade name: Mycoat 506, Mycoat 508), glycoluril compounds (trade name: Cymel 1170, Powderlink 1174), methylated urea resins (trade name: UFR 65), butylated urea resins (trade name: UFR300, U-VAN 10S60, U-VAN 10R, U-VAN 11HV), urea/formaldehyde resins manufactured by Dainippon Ink and Chemistry Incorporated (trade name: Beckamine J-300S, Beckamine P-955, Beckamine N) and the like.

In addition, the crosslinking compounds that can be used include polymers produced by use of acrylamide compounds or methacrylamide compounds substituted with hydroxymethyl group or alkoxymethyl group, such as N-hydroxymethylacrylamide, N-methoxymethylmethacrylamide, N-ethoxymethylacrylamide, and N-butoxymethylmethacrylamide, etc. Such polymers include for example poly(N-butoxymethylacrylamide), a copolymer of N-butoxymethylacrylamide with styrene, a copolymer of N-hydroxymethylmathacrylamide with methylmethacrylate, a copolymer of N-ethoxymethymethacrylamide with benzylmethacrylate, and a copolymer of N-butoxymethylacrylamide, benzylmethacrylate and 2-hydroxypropylmethacrylate, and the like.

These crosslinking compounds can take place crosslinking reaction due to self-condensation. In addition, they can take place crosslinking reaction with a hydroxy on the polymer having the repeating structural unit of formula (1) or (2). Due to such a crosslinking reaction, the formed anti-reflective coating becomes tough, and has a low solubility in organic solvents. The crosslinking compounds may be used singly or in a combination of two or more.

The anti-reflective coating forming composition for lithography according to the present invention can contain an acid compound. The acid compound includes for example sulfonic acid compounds such as p-toluene sulfonic acid, trifluoromethane sulfonic acid, pyridinium-p-toluenesulfonate, salicylic acid, camphor sulfonic acid, sulfosalicylic acid, 4-chlorobenzene sulfonic acid, 4-hydroxybenzene sulfonic acid, benzene disulfonic acid, 1-naphthalene sulfonic acid and pyridinium-1-naphthalene sulfonic acid, etc., and carboxylic acid compounds such as salycylic acid, sulfosalicylic acid, citric acid, benzoic acid, and hydroxy benzoic acid, etc.

In addition, the acid compounds include acid generators that generate an acid with heat or light, such as 2,4,4,6-tetrabromocyclohexadienone, benzointosylate, 2-nitrobenzyltosylate, bis(phenylsulfonyl)diazomethane, p-trifluoromethylbenzene sulfonic acid-2,4-dinitrobenzyl, phenyl-bis(trichloromethyl)-s-triazine, and N-hydroxysuccinimide trifluoromethanesulfonate, etc. The acid compounds also include iodonium salt type acid generators such as diphenyliodonium hexafluorophosphate, diphenyliodonium trifluoromethane sulfonate, diphenyliodonium nonafluoro-n-butane sulfonate, diphenyliodonium perfluoro-n-octane sulfonate, diphenyliodonium camphor sulfonate, bis(4-tert-butylphenyl)iodonium camphor sulfonate and bis(4-tert-butylphenyl)iodoniumtrifluoromethane sulfonate, and the like, sulfonium salt type acid generators such as triphenylsulfonium hexafluoroantimonate, triphenylsulfonium nonafluoro n-butanesulfonate, triphenylsulfonium camphor sulfonate and triphenylsulfonium trifluoromethane sulfonate, and the like, and sulfoneimide compound type acid generators such as N-(trifluoromethanesulfonyloxy)succinimide, N-(nonafluoro n-butanesulfonyloxy)succinimide, N-(camphorsulfonyloxy)succinimide and N-(trifluoromethanesulfonyloxy) naphthalimide. As the acid compound, the sulfonic acid compounds, iodonium salt type acid generators, sulfonium salt type acid generators or sulfoneimide compound type acid generators are preferably used. The acid compounds may be used singly or in a combination of two or more. For example, as the acid compound, only sulfonic acid compounds may be used. In addition, as the acid compound, a combination of a sulfonic compound and a iodonium salt type acid generator, or a combination of a sulfonic compound and a sulfonium salt type acid generator, or a combination of a sulfonic acid and a sulfoneimide compound type acid generator can be used.

When the anti-reflective coating forming composition of the present invention contains the polymer having repeating structural unit of formula (1) or (2) and the crosslinking compound, the contained amount thereof in the solid content is as follows: that of the polymer having the repeating structural unit of formula (1) or (2) is for example 50 to 99 mass %, or 60 to 90 mass %, and that of the crosslinking compound is for example 1 to 50 mass % or 10 to 40 mass %.

When the anti-reflective coating forming composition of the present invention contains the polymer having the repeating structural unit of formula (1) or (2), the crosslinking compound and the acid compound, the contained amount thereof in the solid content is as follows: that of the polymer having the repeating structural unit of formula (1) or (2) is for example 50 to 99 mass %, or 60 to 90 mass %, that of the crosslinking compound is for example 0.5 to 40 mass % or 0.5 to 35 mass %, and that of the acid compound is for example 0.1 to 10 mass % or 0.1 to 5 mass %.

The anti-reflective coating forming composition of the present invention can contain components such as other polymers, light absorbing compounds, rheology controlling agents and surfactants, and the like, if desired.

The other polymers include polymers produced from addition polymerizable compounds. They include addition polymerized polymers from addition polymerizable compounds such as acrylic acid ester compounds, methacrylic acid ester compounds, acrylamide compounds, methacrylamide compounds, vinyl compounds, styrene compounds, maleimide compounds, maleic anhydride, and acrylonitrile, etc. In addition, they include for example polyester, polyamide, polyimide, polyamic acid, polycarbonate, polyether, phenol novolak, cresol novolak, and naphthol novolak, etc. When the other polymer is used, the used amount thereof is for example 0.1 to 40 mass % in the solid content.

The light absorbing compounds can be used without any limitation so long as they have a high absorption for light at photosensitive characteristic wavelength region of photosensitive components in a photoresist layer provided on the anti-reflective coating. The light absorbing compounds include for example benzophenone compounds, benzotriazole compounds, azo compounds, naphthalene compounds, anthracene compounds, anthraquinone compounds, triazine compounds, triazine trione compounds, quinoline compounds, and the like. Concrete examples are for example 1-naphthalene carboxylic acid, 2-naphthalene carboxylic acid, 1-napthtol, 2-naphthol, naphthyl acetic acid, 1-hydroxy-2-naphthalene carboxylic acid, 3-hydroxy-2-naphthalene carboxylic acid, 3,7-dihydroxy-2-naphthalene carboxylic acid, 6-bromo-2-hydroxynaphthalene, 2,6-naphthalene dicarboxylic acid, 9-anthracene carboxylic acid, 10-bromo-9-anthracene carboxylic acid, anthracene-9,10-dicarboxylic acid, 1-anthracene carboxylic acid, 1-hydroxyanthracene, 1,2,3-anthracene triol, 9-hydroxymethylanthracene, 2,7,9-anthracene triol, benzoic acid, 4-hydroxybenzoic acid, 4-bromobenzoic acid, 3-iodobenzoic acid, 2,4,6-tribromophenol, 2,4,6-tribromoresorcinol, 3,4,5-tri-iodo benzoic acid, 2,4,6-tri-iodo-3-aminobenzoic acid, 2,4,6-tri-iodo-3-hydroxybenzoic acid, and 2,4,6-tribromo-3-hydroxybenzoic acid, etc.

When the light absorbing compound is used, the used amount thereof is for example 0.1 to 40 mass % in the solid content.

The rheology controlling agents include for example phthalic acid compounds such as dimethyl phthalate, diethyl phthalate, diisobutyl phthalate, dihexyl phthalate, butyl isodecyl phthalate, or the like, adipic acid compounds such as di-n-butyl adipate, diisobutyl adipate, diisooctyl adipate, octyldecyl adipate, or the like, maleic acid compounds such as di-n-butyl maleate, diethyl maleate, dinonyl maleate, or the like, oleic acid compounds such as methyl oleate, butyl oleate, tetrahydrofurfuryl oleate, or the like, stearic acid compounds such as n-butyl stearate, glyceryl stearate, or the like. When the rheology controlling agent is used, the used amount thereof is for example 0.001 to 10 mass % in the solid content.

The surfactants include for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether, etc., polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., trade name: EFTOP EF301, EF303, EF352 (manufactured by Tochem Products Co., Ltd.), trade name: MEGAFAC F171, F173, R-08, R-30 (manufactured by Dainippon Ink and Chemicals, Inc.), trade name: FLUORAD FC430, FC431 (manufactured by Sumitomo 3M Limited), trade name: ASAHI GUARD AG710, SURFLON S-382, SC101, SC102, SC103, SC104, SC105, SC106 (manufactured by Asahi Glass Co., Ltd.); organosiloxane polymer KP341 (manufactured by Shinetsu Chemical Co., Ltd.), etc. The surfactants may be added singly or in combination of two or more. When the surfactant is used, the used amount thereof is for example 0.0001 to 5 mass % in the solid content.

The solvent used in the anti-reflective coating forming composition of the present invention is not specifically limited so long as it can dissolve the solid content. Such solvents include for example ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate, etc. These solvents are used singly or in combination of two or more. Further, high boiling solvents such as propylene glycol monobutyl ether or propylene glycol monobutyl ether acetate, etc. may be mixed and used.

Hereinafter, the utilization of the anti-reflective coating forming composition of the present invention is described.

The anti-reflective coating forming composition for lithography according to the present invention is applied on a semiconductor substrate (for example, silicon/silicon dioxide coat substrate, silicon nitride substrate, glass substrate, and ITO substrate, etc.) by a suitable coating method, for example, with a spinner, a coater or the like, and thereafter the substrate is baked to fabricate an anti-reflective coating. The conditions of baking are suitably selected from baking temperature of 80 to 250° C. and baking time of 0.3 to 60 minutes. Preferably the baking temperature is 130 to 250° C. and the baking time is 0.5 to 5 minutes. The thickness of the anti-reflective coating is for example 0.01 to 3.0 µm, or preferably for example 0.03 to 1.0 µm, or 0.03 to 0.5 µm, or 0.05 to 0.2 µm.

Then, a photoresist layer is formed on the anti-reflective coating. The formation of the photoresist layer can be conducted by well-known process, that is, by application of a photoresist composition solution on the anti-reflective coating and baking. The photoresist to be formed on the anti-reflective coating of the present invention is not specifically limited so long as it is sensitive to an exposure light, and any of negative type and positive type photoresists can be used. The photoresist includes a positive type photoresist consisting of a novolak resin and 1,2-naphthoquinone diazide sulfonic acid ester, a chemically-amplified type photoresist which consists of a photoacid generator and a binder having a group which is decomposed with an acid and increases alkali dissolution rate, a chemically-amplified type photoresist consisting of an alkali-soluble binder, a photoacid generator, and a low molecular weight compound which is decomposed with an acid and increases the alkali dissolution rate of the photoresist, and a chemically-amplified photoresist consisting of a photoacid generator, a binder having a group which is decomposed with an acid and increases the alkali dissolution rate, and a low molecular weight compound which is decomposed with an acid and increases the alkali dissolution rate of the photoresist. Also, it includes fluorine atom-containing polymer type photoresist as mentioned in for example, Proc. SPIE, Vol. 3999, 330-334 (2000), Proc. SPIE, Vol. 3999, 357-364 (2000), or Proc. SPIE, Vol. 3999, 365-374 (2000).

Subsequently, exposure to light is carried out through a predetermined mask. For the exposure to light, KrF excimer laser beam (wavelength 248 nm), ArF excimer laser beam (wavelength 193 nm) and F2 excimer laser beam (wavelength 157 nm), etc. can be used. After the exposure, post exposure bake may be performed, if necessary. The post exposure bake is conducted by suitably selecting from a heating temperature of 70 to 150° C. and a heating time of 0.3 to 10 minutes.

Next, development is conducted by use of a developer. For example in case where a positive type photoresist is used, the development results in removal of exposed part of the photoresist and forming of photoresist pattern.

The developer includes for example alkaline aqueous solution e.g., an aqueous solutions of alkali metal hydroxide such as potassium hydroxide, sodium hydroxide or the like, aqueous solution of quaternary ammonium hydroxide such as tetramethylammonium hydroxide, tetraethylammonium hydroxide, choline or the like, an aqueous solution of amine such as ethanolamine, propylamine, ethylenediamine or the like. Further, surfactants can be added in these developers. The condition of development is suitably selected from a temperature of 5 to 50° C. and a time of 10 to 300 seconds.

Then, removal of the anti-reflective coating and processing of the semiconductor substrate are conducted by using the photoresist pattern formed as mentioned above as a protective coating. The removal of the anti-reflective coating is conducted by use of a gas such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, etc.

Before forming the anti-reflective coating of the present invention on a semiconductor substrate, a flattening coating or a gap-fill material layer may be formed. In case where semiconductor substrates having large steps or holes are used, it is preferable that the flattening coating or the gap-fill material layer is formed. The semiconductor substrates on which the anti-reflective coating forming composition of the present invention is applied may be substrates on which an inorganic anti-reflective coating is formed by CVD method or the like, and the anti-reflective coating of the present invention can be formed thereon.

Further, the anti-reflective coating of the present invention can be used as a layer for preventing an interaction between the substrate and the photoresist, as a layer having a function that prevents an adverse effect against the substrate by the material used for the photoresist or by substances formed on exposure to light of the photoresist, as a layer having a function that prevents diffusion of substances formed in the substrate on baking under heating to the upper layer photoresist, and as a barrier layer for reducing any poisoning effect of the photoresist layer by the semiconductor substrate dielectric layer.

In addition, the anti-reflective coating formed from the anti-reflective coating forming composition can be used as a filling agent that can fill via holes without gap by applying it for the substrate on which via holes are formed and which is used in dual damascene process. Further, it can be used as a flattening agent for flattening the surface of semiconductor substrate having unevenness.

Hereinafter, the present invention will be described based on examples further concretely but the present invention is not limited thereto.

EXAMPLES

Synthetic Example 1

After 12.00 g of glycidyl 1,2-cyclohexane dicarboxylate, 4.60 g of fumaric acid, and 0.45 g of benzyltriethyl ammonium chloride were dissolved in 68.22 g of propylene glycol monomethyl ether, the mixture was reacted at 130° C. for 24 hours to obtain a solution containing a polymer. GPC analysis showed that weight average molecular weight of the obtained polymer was 5800 (in terms of standard polystyrene). In the meanwhile, it is assumed that the obtained polymer is a polymer having the structure of formula (29) as a repeating structural unit.

Synthetic Example 2

After 10.00 g of 1,4-butanediol diglycidyl ether (manufactured by Yokkaichi Chemical Company, Limited), 5.92 g of fumaric acid, and 0.58 g of benzyltriethyl ammonium chloride were dissolved in 66.01 g of propylene glycol monomethyl ether, the mixture was reacted at 130° C. for 24 hours to obtain a solution containing a polymer. GPC analysis showed that weight average molecular weight of the obtained polymer was 4800 (in terms of standard polystyrene). In the meanwhile, it is assumed that the obtained polymer is a polymer having the structure of formula (30) as a repeating structural unit.

Synthetic Example 3

After 12.00 g of diglycidyl phthalate (manufactured by Nagase Chemtex Corporation, trade name: Denakol EX721), 4.56 g of fumaric acid, and 0.45 g of benzyltriethyl ammonium chloride were dissolved in 68.01 g of propylene glycol monomethyl ether, the mixture was reacted at 130° C. for 24 hours to obtain a solution containing a polymer. GPC analysis showed that weight average molecular weight of the obtained polymer was 7200 (in terms of standard polystyrene). In the meanwhile, it is assumed that the obtained polymer is a polymer having the structure of formula (22) as a repeating structural unit.

Synthetic Example 4

After 16.00 g of diglycidyl terephthalate (manufactured by Nagase Chemtex Corporation, trade name: Denakol EX711), 6.43 g of fumaric acid, and 0.63 g of benzyltriethyl ammonium chloride were dissolved in 92.23 g of propylene glycol monomethyl ether, the mixture was reacted at 130° C. for 24 hours to obtain a solution containing a polymer. GPC analysis showed that weight average molecular weight of the obtained polymer was 10000 (in terms of standard polystyrene). In the meanwhile, it is assumed that the obtained polymer is a polymer having the structure of formula (21) as a repeating structural unit.

Synthetic Example 5

After 30.00 g of monoallyl diglycidyl isocyanuric acid (manufactured by Shikoku Chemicals Corporation), 12.55 g of fumaric acid, and 1.23 g of benzyltriethyl ammonium chloride were dissolved in 175.60 g of propylene glycol monomethyl ether, the mixture was reacted at 130° C. for 24 hours to obtain a solution containing a polymer. GPC analysis showed that weight average molecular weight of the obtained polymer was 22000 (in terms of standard polystyrene). In the meanwhile, it is assumed that the obtained polymer is a polymer having the structure of formula (19) as a repeating structural unit.

Synthetic Example 6

After 13.75 g of monoallyl diglycidyl isocyanuric acid, 5.00 g of glycidyl 1,2-cyclohexane dicarboxylate, 7.67 g of fumaric acid, and 0.75 g of benzyltriethyl ammonium chloride were dissolved in 108.7 g of propylene glycol monomethyl ether, the mixture was reacted at 130° C. for 24 hours to obtain a solution containing a polymer. GPC analysis showed that weight average molecular weight of the obtained polymer was 14000 (in terms of standard polystyrene). In the meanwhile, it is assumed that the obtained polymer is a polymer having the structures of formulae (19) and (29) as repeating structural units.

Synthetic Example 7

After 9.17 g of monoallyl diglycidyl isocyanuric acid, 10.00 g of glycidyl 1,2-cyclohexane dicarboxylate, 7.67 g of fumaric acid, and 0.75 g of benzyltriethyl ammonium chloride were dissolved in 110.37 g of propylene glycol monomethyl ether, the mixture was reacted at 130° C. for 24 hours to obtain a solution containing a polymer. GPC analysis showed that weight average molecular weight of the obtained polymer was 11000 (in terms of standard polystyrene). In the meanwhile, it is assumed that the obtained polymer is a polymer having the structures of formulae (19) and (29) as repeating structural units.

Synthetic Example 8

After 16.97 g of monoallyl diglycidyl isocyanuric acid, 4.00 g of 1,4-butanediol diglycidyl ether, 9.47 g of fumaric acid, and 0.93 g of benzyltriethyl ammonium chloride were dissolved in 125.5 g of propylene glycol monomethyl ether, the mixture was reacted at 130° C. for 24 hours to obtain a solution containing a polymer. GPC analysis showed that weight average molecular weight of the obtained polymer was 9800 (in terms of standard polystyrene). In the meanwhile, it is assumed that the obtained polymer is a polymer having the structures of formulae (19) and (30) as repeating structural units.

Synthetic Example 9

After 11.32 g of monoallyl diglycidyl isocyanuric acid, 8.00 g of 1,4-butanediol diglycidyl ether, 9.47 g of fumaric acid, and 0.93 g of benzyltriethyl ammonium chloride were dissolved in 118.9 g of propylene glycol monomethyl ether, the mixture was reacted at 130° C. for 24 hours to obtain a solution containing a polymer. GPC analysis showed that weight average molecular weight of the obtained polymer was 8000 (in terms of standard polystyrene). In the meanwhile, it is assumed that the obtained polymer is a polymer having the structures of formulae (19) and (30) as repeating structural units.

Synthetic Example 10

After 14.32 g of diglycidyl terephthalate, 5.00 g of glycidyl 1,2-cyclohexane dicarboxylate, 7.67 g of fumaric acid, and 0.75 g of benzyltriethyl ammonium chloride were dissolved in 111.0 g of propylene glycol monomethyl ether, the mixture was reacted at 130° C. for 24 hours to obtain a solution containing a polymer. GPC analysis showed that weight average molecular weight of the obtained polymer was 9700 (in terms of standard polystyrene). In the meanwhile, it is assumed that the obtained polymer is a polymer having the structures of formulae (21) and (29) as repeating structural units.

Synthetic Example 11

After 9.55 g of diglycidyl terephthalate, 10.00 g of glycidyl 1,2-cyclohexane dicarboxylate, 7.67 g of fumaric acid, and 0.75 g of benzyltriethyl ammonium chloride were dissolved in 111.89 g of propylene glycol monomethyl ether, the mixture was reacted at 130° C. for 24 hours to obtain a solution containing a polymer. GPC analysis showed that weight average molecular weight of the obtained polymer was 8500 (in terms of standard polystyrene). In the meanwhile, it is assumed that the obtained polymer is a polymer having the structures of formulae (21) and (29) as repeating structural units.

Synthetic Example 12

After 15.47 g of diglycidyl terephthalate, 3.50 g of 1,4-butanediol diglycidyl ether, 8.29 g of fumaric acid, and 0.81 g of benzyltriethyl ammonium chloride were dissolved in 112.3 g of propylene glycol monomethyl ether, the mixture was reacted at 130° C. for 24 hours to obtain a solution containing a polymer. GPC analysis showed that weight average molecular weight of the obtained polymer was 7000 (in terms of standard polystyrene). In the meanwhile, it is assumed that the obtained polymer is a polymer having the structures of formulae (21) and (30) as repeating structural units.

Synthetic Example 13

After 10.32 g of diglycidyl terephthalate, 7.00 g of 1,4-butanediol diglycidyl ether, 8.29 g of fumaric acid, and 0.81 g of benzyltriethyl ammonium chloride were dissolved in 105.7 g of propylene glycol monomethyl ether, the mixture was reacted at 130° C. for 24 hours to obtain a solution containing a polymer. GPC analysis showed that weight average molecular weight of the obtained polymer was 6500 (in terms of standard polystyrene). In the meanwhile, it is assumed that the obtained polymer is a polymer having the structures of formulae (21) and (30) as repeating structural units.

Synthetic Example 14

After 15.16 g of diglycidyl phthalate (manufactured by Nagase Chemtex Corporation, trade name: Denakol EX721), 5.00 g of glycidyl 1,2-cyclohexane dicarboxylate, 7.67 g of fumaric acid, and 0.75 g of benzyltriethyl ammonium chloride were dissolved in 114.3 g of propylene glycol monomethyl ether, the mixture was reacted at 130° C. for 24 hours to obtain a solution containing a polymer. GPC analysis showed that weight average molecular weight of the obtained polymer was 7000 (in terms of standard polystyrene). In the meanwhile, it is assumed that the obtained polymer is a polymer having the structures of formulae (22) and (29) as repeating structural units.

Synthetic Example 15

After 10.10 g of diglycidyl phthalate, 10.00 g of glycidyl 1,2-cyclohexane dicarboxylate, 7.67 g of fumaric acid, and 0.75 g of benzyltriethyl ammonium chloride were dissolved in 114.11 g of propylene glycol monomethyl ether, the mixture was reacted at 130° C. for 24 hours to obtain a solution containing a polymer. GPC analysis showed that weight average molecular weight of the obtained polymer was 6100 (in terms of standard polystyrene). In the meanwhile, it is assumed that the obtained polymer is a polymer having the structures of formulae (22) and (29) as repeating structural units.

Synthetic Example 16

After 16.37 g of diglycidyl phthalate, 3.50 g of 1,4-butanediol diglycidyl ether, 8.29 g of fumaric acid, and 0.81 g of benzyltriethyl ammonium chloride were dissolved in 115.9 g of propylene glycol monomethyl ether, the mixture was reacted at 130° C. for 24 hours to obtain a solution containing a polymer. GPC analysis showed that weight average molecular weight of the obtained polymer was 6800 (in terms of standard polystyrene). In the meanwhile, it is assumed that the obtained polymer is a polymer having the structures of formulae (22) and (30) as repeating structural units.

Synthetic Example 17

After 10.91 g of diglycidyl phthalate, 7.00 g of 1,4-butanediol diglycidyl ether, 8.29 g of fumaric acid, and 0.81 g of benzyltriethyl ammonium chloride were dissolved in 108.1 g of propylene glycol monomethyl ether, the mixture was reacted at 130° C. for 24 hours to obtain a solution containing a polymer. GPC analysis showed that weight average molecular weight of the obtained polymer was 5600 (in terms of standard polystyrene). In the meanwhile, it is assumed that the obtained polymer is a polymer having the structures of formulae (22) and (30) as repeating structural units.

Example 1

In 10 g of the solution containing the polymer obtained in Synthetic Example 1, 0.5 g of tetramethoxymethylglycoluril (manufactured by Mitsui Cytec Co., Ltd., trade name: Powderlink 1174), 0.05 g of pyridinium-p-toluene sulfonic acid, 35.4 g of propylene glycol monomethyl ether, and 18.6 g of propylene glycol monomethyl ether acetate were added, and then filtered through a micro filter made of polyethylene having a pore diameter of 0.10 µm and further through a micro filter made of polyethylene having a pore diameter of 0.05 µm to prepare an anti-reflective coating forming composition solution for lithography.

Examples 2 to 17

Similarly to Example 1, in 10 g of each solution containing the polymer obtained in Synthetic Examples 2 to 17, 0.5 g of tetramethoxymethylglycoluril (manufactured by Mitsui Cytec Co., Ltd., trade name: Powderlink 1174), 0.05 g of pyridinium-p-toluene sulfonic acid, 35.4 g of propylene glycol monomethyl ether, and 18.6 g of propylene glycol monomethyl ether acetate were added, and then filtered through a micro filter made of polyethylene having a pore diameter of 0.10 µm and further through a micro filter made of polyethylene having a pore diameter of 0.05 µm to prepare anti-reflective coating forming composition solutions for lithography.

Dissolution Test in Photoresist Solvent

The anti-reflective coating forming composition solutions for lithography prepared in Examples 1 to 17 were coated on semiconductor substrates (silicon wafers) by means of a spinner, respectively. The coated silicon wafers were baked at 205° C. for 1 minute on a hot plate to form anti-reflective coatings (film thickness 0.10 µm). The anti-reflective coatings were dipped in solvents used for photoresists, such as ethyl lactate and propylene glycol monomethyl ether, and as a result it was confirmed that the resulting anti-reflective coatings were insoluble in these solvents.

Test of Intermixing with Photoresist

The anti-reflective coating forming composition solutions for lithography prepared in Examples 1 to 17 were coated on semiconductor substrates (silicon wafers) by means of a spinner, respectively. The coated silicon wafers were baked at 205° C. for 1 minute on a hot plate to form anti-reflective coatings (film thickness 0.10 µm). On each of the resulting anti-reflective coatings, a commercially available photoresist solution (manufactured by Shipley Corporation, trade name: UV113) was coated by means of a spinner. The coated wafers were heated at 120° C. for 1 minute on a hot plate to form photoresist layers. After exposure of the photoresists to light, post exposure bake was performed at 115° C. for 1.5 minute. After developing the photoresists, the film thickness of the anti-reflective coatings was measured and it was confirmed that no intermixing occurred between the anti-reflective coatings and the photoresists.

Test of Optical Parameter

The anti-reflective coating forming composition solutions for lithography prepared in Examples 1 to 17 were coated on silicon wafers by means of a spinner, respectively. The coated silicon wafers were baked at 205° C. for 1 minute on a hot plate to form anti-reflective coatings (film thickness 0.60 µm). On the anti-reflective coatings, refractive index (n) and attenuation coefficient (k) at a wavelength of 193 nm were measured with a spectroscopic ellipsometer (manufactured by J. A. Woolam Co., Inc., VUV-VASE VU-302). The measurement results are shown in Table 1.

Measurement of Dry Etching Rate

The anti-reflective coating forming composition solutions prepared in Examples 1 to 17 were coated on silicon wafers by means of a spinner, respectively. The coated silicon wafers were baked at 205° C. for 1 minute on a hot plate to form anti-reflective coatings. Then, dry etching rate (decreased amount of film thickness per unit time) on these anti-reflective coatings was measured with RIE system ES401 manufactured by Nippon Scientific Co., Ltd. under the condition in which tetrafluoromethane was used as dry etching gas.

Similarly, a photoresist solution (trade name: PAR710 manufactured by Sumitomo Chemical Co., Ltd.) was coated on a silicon wafer by means of a spinner. The coated silicon wafer was baked at 95° C. for 1 minute on a hot plate to form a photoresist layer. Then, dry etching rate was measured with RIE system ES401 manufactured by Nippon Scientific Co., Ltd. under the condition in which tetrafluoromethane was used as dry etching gas. The dry etching rate was compared between the anti-reflective coatings formed from the compositions of Examples 1 to 5 and photoresist PAR710 manufactured by Sumitomo Chemical Co., Ltd. The results are shown in Table 1. In Table 1, selection ratio means the etching rate of each anti-reflective coating formed from each composition of Examples in case where the dry etching rate of the photoresist PAR710 is regarded as 1.00.

TABLE 1

| | n | k | Selection Ratio |
|---|---|---|---|
| Example 1 | 1.65 | 0.11 | 1.5 |
| Example 2 | 1.61 | 0.11 | 1.6 |
| Example 3 | 1.54 | 0.40 | 1.6 |
| Example 4 | 1.59 | 0.44 | 1.6 |
| Example 5 | 1.83 | 0.33 | 1.9 |
| Example 6 | 1.77 | 0.26 | 1.8 |
| Example 7 | 1.73 | 0.20 | 1.7 |
| Example 8 | 1.76 | 0.24 | 1.9 |
| Example 9 | 1.72 | 0.22 | 1.8 |
| Example 10 | 1.59 | 0.34 | 1.6 |
| Example 11 | 1.59 | 0.26 | 1.6 |
| Example 12 | 1.57 | 0.36 | 1.6 |
| Example 13 | 1.58 | 0.28 | 1.6 |
| Example 14 | 1.55 | 0.32 | 1.6 |
| Example 15 | 1.57 | 0.25 | 1.6 |
| Example 16 | 1.54 | 0.34 | 1.6 |
| Example 17 | 1.56 | 0.28 | 1.6 |

From these results in Table 1, it was found that the anti-reflective coatings prepared from the anti-reflective coating forming compositions of the present invention had a higher selection ratio of dry etching rate compared with photoresists. Therefore, time required for removing the anti-reflective coating by dry etching can be shortened, and undesirable phenomenon that film thickness of photoresist layer is reduced accompanied with removal of anti-reflective coatings by dry etching can be inhibited.

The invention claimed is:

1. An anti-reflective coating forming composition for lithography comprising:

a polymer having a repeating structural unit of formula (1) or (2):

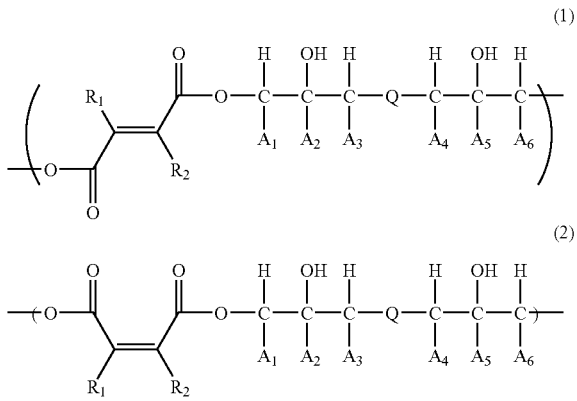

wherein $R_1$ and $R_2$ independently of each other are hydrogen atom, methyl, ethyl or halogen atom, $A_1$, $A_2$, $A_3$, $A_4$, $A_5$, $A_6$ and $A_6$ independently of one another are hydrogen atom, methyl or ethyl, Q is a group of formula (3) or (4):

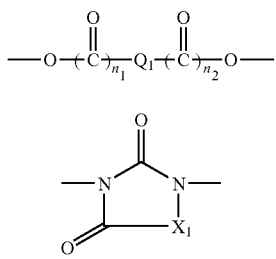

wherein $Q_1$ is $C_{1-15}$alkylene, phenylene, naphthylene or anthrylene, and the phenylene, naphthylene and anthrylene may be substituted by a substituent selected from the group consisting of $C_{1-6}$alkyl, halogen atom, $C_{1-6}$alkoxy, nitro, cyano, hydroxy and $C_{1-6}$alkylthio, $n_1$ and $n_2$ independently of each other are a number of 0 or 1, $X_1$ is a group of formula (5), (6) or (7)

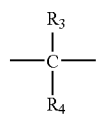

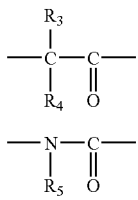

wherein $R_3$ and $R_4$ independently of each other are hydrogen atom, $C_{1-6}$alkyl, $C_{3-6}$alkenyl, benzyl or phenyl, and the phenyl may be substituted by a substituent selected from the group consisting of $C_{1-6}$alkyl, halogen atom, $C_{1-6}$alkoxy, nitro, cyano, hydroxy and $C_{1-6}$alkylthio, or $R_3$ and $R_4$ together may form $C_{3-6}$ring, $R_5$ is $C_{1-6}$alkyl, $C_{3-6}$alkenyl, benzyl or phenyl, and the phenyl may be substituted by a substituent selected from the group consisting of $C_{1-6}$alkyl, halogen atom, $C_{1-6}$alkoxy, nitro, cyano, hydroxy and $C_{1-6}$alkylthio, and a solvent.

2. The anti-reflective coating forming composition for lithography according to claim 1, wherein the polymer is a polymer produced by polyaddition reaction of a compound of formula (8) or (9) with a compound of formula (10):

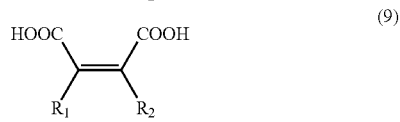

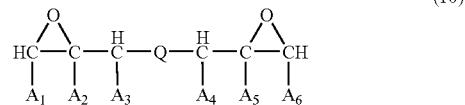

wherein $R_1$, $R_2$, $A_1$, $A_2$, $A_3$, $A_4$, $A_5$, $A_6$ and Q are as defined above.

3. The anti-reflective coating forming composition for lithography according to claim 2, wherein the compound of formula (10) is a compound of formula (11):

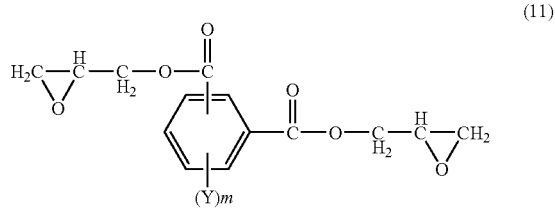

wherein Y is $C_{1-6}$alkyl, halogen atom, $C_{1-6}$alkoxy, nitro, cyano, hydroxy or $C_{1-4}$alkylthio, m is an integer of 0 to 4, and when m is 2 to 4, the above-mentioned Y may be identical with or different from each other.

4. The anti-reflective coating forming composition for lithography according to claim 1, wherein the polymer is a polymer having a repeating structural unit of formula (12):

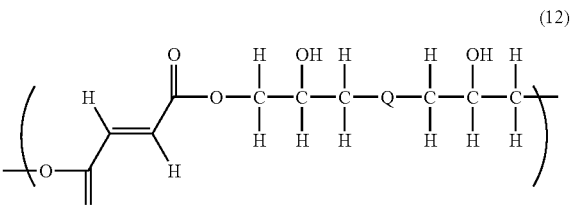

wherein Q is as defined above.

5. The anti-reflective coating forming composition for lithography according to claim 1, wherein the polymer is a polymer having a repeating structural unit of formulae (13) and (14):

(13)
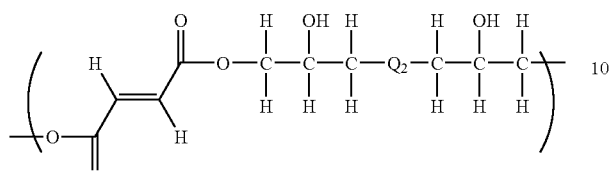

(14)
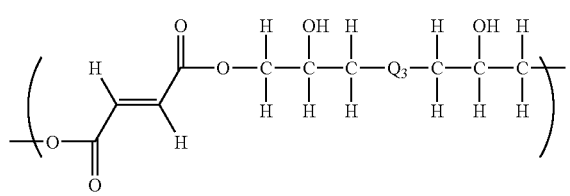

wherein $Q_2$ is a group of formula (15), (16) or (17):

(15)
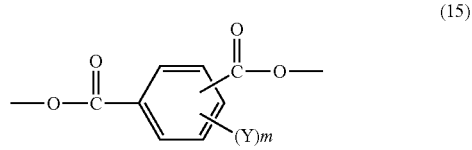

(16)
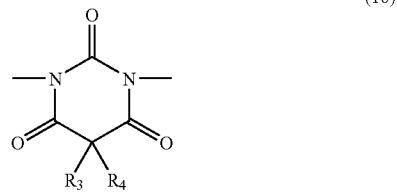

(17)
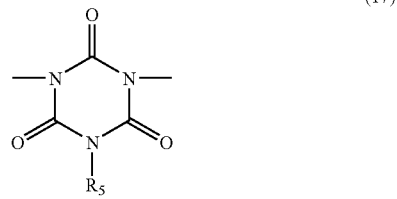

wherein Y, m, $R_3$, $R_4$ and $R_5$ are as defined above, $Q_3$ is a group of formula (18):

(18)
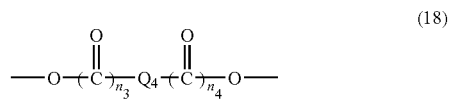

wherein $Q_4$ is $C_{1-15}$alkylene, $n_3$ and $n_4$ independently of each other are a number of 0 or 1.

6. The anti-reflective coating forming composition for lithography according to claim 1, comprising further a crosslinking compound.

7. The anti-reflective coating forming composition for lithography according to claim 6, comprising further an acid compound.

8. The anti-reflective coating forming composition for lithography according to claim 6, wherein the crosslinking compound is a nitrogen-containing compound containing 2 to 4 nitrogen atoms substituted with methylol or alkoxymethyl.

9. The anti-reflective coating forming composition for lithography according to claim 7, wherein the acid compound is a sulfonic acid compound.

10. The anti-reflective coating forming composition for lithography according to claim 7, wherein the acid compound is a combination of a iodonium salt based acid generator or a sulfonium salt based acid generator with a sulfonic acid compound.

11. A method for forming photoresist pattern for use in manufacture of semiconductor device, comprising the steps of:

coating the anti-reflective coating forming composition for lithography according to claim 1 on a semiconductor substrate, and baking it to form an anti-reflective coating, forming a photoresist layer on the anti-reflective coating, exposing the semiconductor substrate covered with the anti-reflective coating and the photoresist layer to light, and developing the photoresist layer after the exposure to light.

12. The method for forming photoresist pattern according to claim 11, wherein the exposure to light is carried out with ArF excimer laser beam (wavelength 193 nm).

* * * * *